United States Patent [19]
Furuhashi

[11] 3,927,333
[45] Dec. 16, 1975

[54] ELECTRONIC CIRCUIT COMPRISING COMPLEMENTARY SYMMETRICAL TRANSISTORS

[75] Inventor: Tokio Furuhashi, Tokyo, Japan

[73] Assignee: Nippon Electric Company, Ltd., Tokyo, Japan

[22] Filed: Mar. 29, 1974

[21] Appl. No.: 456,176

[30] Foreign Application Priority Data

Apr. 7, 1973 Japan ................................ 48-39911

[52] U.S. Cl. .................. 307/255; 307/270; 330/13; 330/17

[51] Int. Cl.$^2$ ...................... H03K 17/60; H03F 3/18

[58] Field of Search ...... 307/255, 262, 270, 330/13, 330/17

[56] References Cited

UNITED STATES PATENTS 3,054,067 9/1962 Merrill et al. ..................... 330/13 X

*Primary Examiner*—R. V. Rolinec
*Assistant Examiner*—Lawrence J. Dahl
*Attorney, Agent, or Firm*—John M. Calimafde

[57] ABSTRACT

First and second pairs of complementary NPN and PNP transistors have their base and emitter terminals connected in common, a load being disposed intermediate the emitter terminal junctions. By differentially driving the common transistor base junctions a current will flow bidirectionally through the load; and complementary drivers connected to the collectors of a transistor pair provide a current sinking-current source capability at their common collector junction-as for directly driving a logic circuit.

2 Claims, 4 Drawing Figures

ELECTRONIC CIRCUIT COMPRISING COMPLEMENTARY SYMMETRICAL TRANSISTORS

Figure 1:
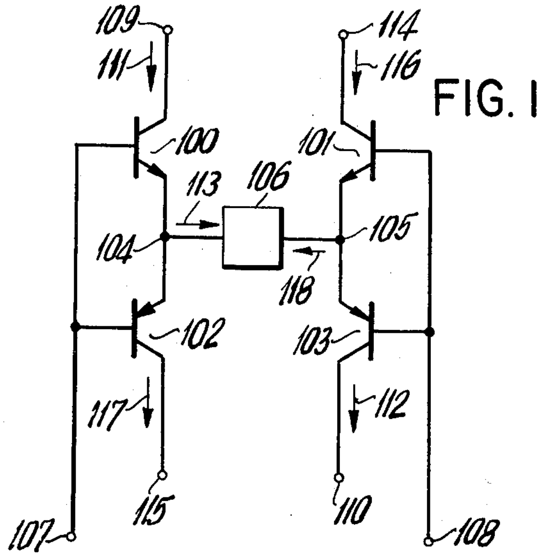

The present invention relates to electronic circuits, and more particularly to electronic circuits of the type comprising complementary-symmetrical transistors.

As generally realized, it is often desired that an electronic circuit have a source current capability and a sink current capability available at its output. This need may be met by the use of a complementary symmetrical amplifier circuit such as utilized in an operational amplifier. The electronic circuit is expected also to be capable of providing output signals of opposite polarities. This electronic circuit, however, must have an output circuit such as an inverter circuit in addition to the complementary-symmetrical amplifier circuit.

The complementary-symmetrical amplifier circuit is often required to have an output of a proper form fit to drive a logic circuit. For such a case, it is very likely that the output level of the amplifier circuit does not match the input level of the logic circuit. This necessitates careful interfacing between the two circuits, especially on a semiconductor integrated circuit, which requires the expenditure technical effort and increases costs. This is one major reason why the use of semiconductor integrated circuits has been confined to a limited range.

It is therefore, an object of the present invention to provide an electronic circuit to which a logic circuit can be easily coupled, and which has an output exhibiting both a current sinking and current source capability.

Another object of the present invention is to provide an electronic circuit capable of generating output signals with polarities opposite to each other.

Briefly, the electronic circuit of this invention comprises impedance means; a first NPN transistor and a first PNP transistor having their bases connected in common; and a second NPN transistor and a second PNP transistor having their base terminals connected in common; the emitters of the first NPN transistor and the second PNP transistor being connected to each other through the impedance means, and the emitters of the second NPN transistor and the first PNP transistor being connected to each other through the impedance means.

This electronic circuit operates in the following manner. When a suitable bias is applied from a bias source to the collector of each transistor, and an input signal is applied differentially across the base-common junctions, then two of the transistors, (for example, the first NPN transistor and the second PNP transistor) are rendered conductive, depending upon the applied input signal, and a current path is formed by these transistors and the impedance element connected between their emitters. When the input signal changes, the second NPN transistor and the first PNP transistor turn on, while the first NPN transistor and the second PNP transistor are rendered nonconductive. As a result, another current path is formed by the second NPN transistor, the first PNP transistor and the impedance element connected between their emitters. Thus, the electronic circuit makes output signals available from the individual transistor collectors, which stand at mutually inverted polarities. In addition, the electronic circuit enables its output to exhibit source current capability and sink current capability. Furthermore, the invention permits a logic circuit to be readily and easily coupled to the output of the electronic circuit.

Figure 2:
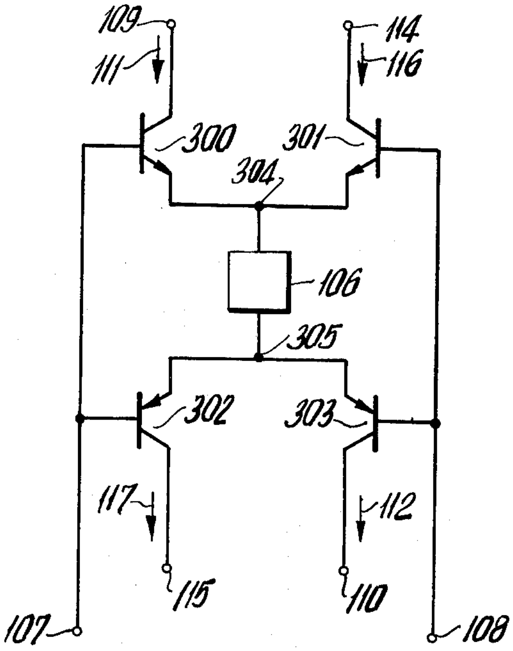
Figure 4:
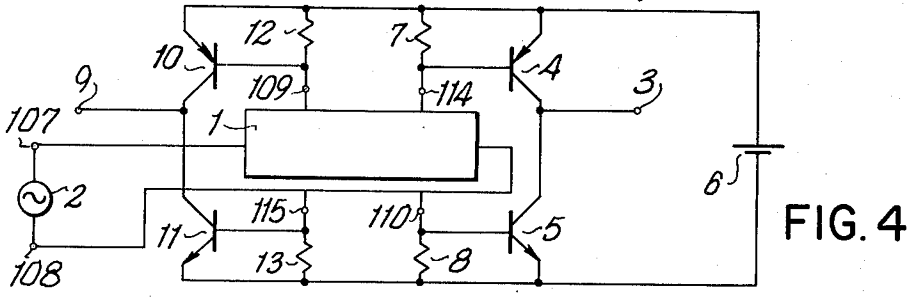
Figure 3:
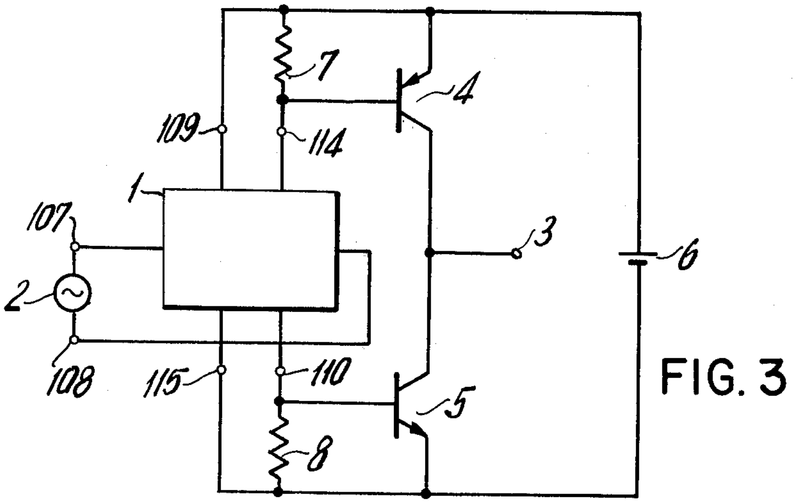

The other objects, features and advantages of the present invention will become more apparent from the following description, presented in conjunction with the accompanying drawings, wherein:

FIG. 1 is a circuit diagram showing an illustrative embodiment of the invention, FIG. 2 is a circuit diagram showing another embodiment of the invention, FIG. 3 is a circuit diagram showing an example of the application of this invention; and FIG. 4 is a circuit diagram showing an example of another application of this invention.

Referring now to FIG. 1, an NPN transistor 100 and a PNP transistor 102 have their emitter terminals connected in common at a junction 104, and an NPN transistor 101 and a PNP transistor have emitters connected in common at a junction 105. The two junctions are connected to each other by way of an impedance element 106 such as a resistor. An input terminal 107 is connected to the base terminals of the transistors 100 and 102. Similarly, the other input terminal 108 is connected to the bases of the transistors 101 and 103. The input signal may be applied differentially across the input terminals 107 and 108, or the signal may be applied only to the terminal 107, with the terminal 108 kept at a reference potential.

In this electronic circuit, current will flow in the transistors in the following manner when an input signal is applied across the terminals 107 and 108. Assume that the terminal 107 stands at a higher potential than the terminal 108. The base-emitter junctions of the NPN transistor 100 and PNP transistor 103 are then in a forward biased state. Accordingly, collector currents 111 and 112 flow in the collector 109 of transistor 100 and the collector 110 of transistor 103 respectively. The two collector currents are nearly the same because these currents flow serially by way of the impedance element 106 through which a current 113 flows. Under the assumed condition, the NPN transistor 101 and the PNP transistor 102 are in the off state and, hence, the currents flowing in their collectors 114 and 115 are near zero.

From this assumed state the collector currents 111 and 112 decrease as the potential difference betwen the terminals 107 and 108 decreases. When the potential relationship between the terminals 107 and 108 is reversed, i.e., the potential becomes higher at the terminal 108 than at the terminal 107, the collector currents 116 and 117 flow, while the collector currents 111 and 112 become substantially zero since the circuit is of symmetrical configuration. The collector currents 116 and 117 flow through the impedance element 106 where a current 118 passes. The currents 113 and 118 are opposite to each other. The transistors 100, 101, 102 and 103 are suitably biased as in a usual complementary-symmetrical amplifier circuit in order to switch smoothly from one state to the other, that is, from the state where the transistors 100 and 103 are active (on) and the transistors 101 and 102 are inactive (off), to the state where the transistors 101 and 102 are active and the transistors 100 and 103 are inactive, and vice versa. The relationship between the currents 111 and 117 is such that one remains zero while the other flows. This relationship obtains also between the currents 112 and 116.

Another embodiment of the invention will be described with reference to FIG. 2 wherein like constituent elements are indicated by the identical references shown in FIG. 1. In FIG. 2, NPN transistors 300 and 301 have their emitters connected in common at a junction 304, and PNP transistors 302 and 303 have emitter terminals connected in common at a junction 305. The junctions 304 and 305 are connected to each other by way of an impedance element 106. An input control signal is applied across terminals 107 and 108. The relationship between a current 111 flowing in the collector 109 of transistor 300 and a current 112 flowing in the collector 110 of transistor 303, and the relationship between a current 116 flowing in the collector 114 of transistor 301 and a current 117 flowing in the collector 115 of transistor 302 are similar to those between the corresponding collector currents shown in the FIG. 1 embodiment.

The circuit of FIG. 2 operates like the one shown in FIG. 1, excepting that the switching currents which flow through the impedance element 106 are in the same direction, contrary to the currents 113 and 118 (FIG. 1) which flow through the impedance element 106 in mutually opposing directions. For smooth switching between on and off states, the transistors 300, 301, 302 and 303 are suitably biased.

For a more concrete illustration of the instant invention, an illustrative application is shown in FIG. 3 wherein the numeral 1 denotes an electronic circuit according to the present invention. A signal source 2 is connected between input terminals 107 and 108, output terminals 109 and 115 of the electronic circuit 1 are connected to the the positive and negative terminals of a power source 6 respectively, and output terminals 114 and 110 are also connected to the positive and negative terminals of the power source 6, respectively, by way of resistors 7 and 8. The output terminal 114 is connected to the base of a PNP transistor 4, and the output terminal is 110 connected to the base of an NPN transistor 5. The transistors 4 and 5 have their collectors connected in common at an output terminal 3. The emitters of these transistors are respectively connected to the positive and negative terminals of the power source 6. Thus, when a current flows in the terminal 110 to cause the transistor 5 to be conducting, the transistor 4 is nonconductive. Accordingly, when a load is connected to the output terminal 3, a sink current is supplied thereto through the transistor 5. Under this condition, a logic circuit can be driven directly by the output from the terminal 3 by suitably determining the collector-emitter voltage $V_{CE(SAT)}$ of the transistor 5 in its saturation state.

Correspondingly, when a current flows in the terminal 114 thus causing the transistor 4 to become conductive, a source current is supplied to the load connected to the output terminal 3. In this state the transistor 5 is in its off-state. The transistors 4 and 5 thus never are simultaneously conducting. Accordingly, there is no possibility of causing a large current to flow during a transition from one circuit state to another.

It will be obvious that the circuit added across the terminals 114 and 110 may similarly be used across the terminals 109 and 115 whereby an output signal is obtained simultaneously with the signal generated at the output terminal 3, but characterized by an opposite polarity. Therefore, the electronic circuit of this invention can effectively be utilized in many ways, such as for use with a logic circuit where an inverted signal is often needed.

FIG. 4 illustrates another example of an application of the invention in the form of a dual output circuit, wherein, as in FIG. 3, the numeral 1 denotes an electronic circuit according to the present invention. Moreover, corresponding elements of the circuits of FIGS. 3 and 4 are identified by corresponding reference numerals. The circuit of FIG. 4 further includes resistors 12 and 13 connected between the terminals 109 and 115 and the emitters of PNP transistor 10 and NPN transistor 11, respectively. The bases of transistors 10 and 11 are connected to terminals 109 and 115, respectively, and the collectors of these transistors are connected in common at an output terminal 9, which, along with terminal 3, constitute the dual outputs of the circuit.

Although only a few embodiments of the present invention have been illustrated and described in detail, it is to be particularly understood that the invention is not limited thereto or thereby.

The above described arrangement is merely illustrative of the principles of the present invention. Numerous modifications and adaptations thereof will be readily apparent to those skilled in the art without departing from the spirit and scope of the present invention.

What is claimed is:

1. An electronic circuit comprising a power supply having first and second terminals, first and second and third impedance means, a first NPN transistor and a first PNP transistor having their bases connected in common at a first junction, a second NPN transistor and a second PNP transistor having their bases connected in common at a second junction, the emitters of said first NPN transistor and said second PNP transistor being connected to each other through said first impedance means, the emitters of said second NPN transistor and said first PNP transistor being connected to each other through said first impedance means, the collector of said first NPN transistor being connected to said first terminal of said power supply through said second impedance means, the collector of said first PNP transistor being connected to said second terminal of said power supply through said third impedance means, the collectors of said second NPN transistor and said second PNP transistor being connected to said first and second terminals of said power supply, respectively, an output terminal, a third NPN transistor and a third PNP transistor having their collectors connected in common at said output terminal, the bases of said third NPN transistor and said third PNP transistor being connected to the collectors of said first PNP transistor and said first NPN transistor, respectively, the emitters of said third NPN transistor and said third PNP transistor being connected to said second and first terminals of said power supply, respectively, and input signal supplying means connected between said first junction and said second junction, whereby sink and source currents are obtained at said output terminal.

2. An electronic circuit comprising a power supply having first and second terminals, first, second, third, fourth and fifth impedance means, a first NPN transistor and a first PNP transistor having their bases connected in common at a first junction, a second NPN transistor and a second PNP transistor having their bases connected in common at a second junction, the emitters of said first NPN transistor and said second PNP transistor being connected to each other through said first impedance means, the emitters of said second NPN transistor and said first PNP transistor being connected to each other through said first impedance means, the collectors of said first NPN transistor and said second NPN transistor being connected to said first terminal of said power supply through said second and third impedance means, respectively, the collectors of said first PNP transistor and said second PNP transistor being connected to said second terminal of said power supply through said fourth and fifth impedance means, respectively, a third NPN transistor and a third PNP transistor having their collectors connected in common at a first output terminal, the bases of said third NPN transistor and said third PNP transistor being connected to the collectors of said first PNP transistor and said first NPN transistor, respectively, the emitters of said third NPN transistor and said third PNP transistor being connected to said second and first terminals of said power supply, respectively, a fourth NPN transistor and a fourth PNP transistor having their collectors connected in common at a second output terminal, the bases of said fourth NPN transistor and said fourth PNP transistor being connected to the collectors of said second PNP transistor and said second NPN transistor, respectively, the emitters of said fourth NPN transistor and said fourth PNP transistor being connected to said second and first terminals of said power supply, respectively, and input signal supplying means connected between said first junction and said second junction, whereby sink and source currents are simultaneously obtained at said first and second output terminals, respectively, and source and sink currents are simultaneously obtained at said first and second output terminals, respectively.

* * * * *